United States Patent
Weiland

(10) Patent No.: US 7,253,619 B2
(45) Date of Patent: Aug. 7, 2007

(54) METHOD FOR EVALUATING MAGNETIC RESONANCE SPECTROSCOPY DATA USING A BASELINE MODEL

(75) Inventor: Elisabeth Weiland, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 670 days.

(21) Appl. No.: 10/818,021

(22) Filed: Apr. 5, 2004

(65) Prior Publication Data

US 2005/0137476 A1   Jun. 23, 2005

(30) Foreign Application Priority Data

Apr. 4, 2003 (DE) ............... 103 15 540
Nov. 13, 2003 (DE) ............... 103 53 211
Mar. 12, 2004 (DE) ............. 10 2004 012 286

(51) Int. Cl.
*G01V 3/00* (2006.01)

(52) U.S. Cl. ...................... 324/307; 324/300

(58) Field of Classification Search ............... 324/307, 324/300; 600/410
See application file for complete search history.

(56) References Cited

U.S. PATENT DOCUMENTS

| | | | | |
|---|---|---|---|---|
| 5,218,529 A | * | 6/1993 | Meyer et al. | ............... 702/28 |
| 5,446,681 A | * | 8/1995 | Gethner et al. | ............... 702/27 |
| 6,617,169 B2 | * | 9/2003 | Ke et al. | ............... 436/173 |
| 7,184,813 B1 | * | 2/2007 | Hurd et al. | ............... 600/410 |
| 2003/0028093 A1 | * | 2/2003 | Ke et al. | ............... 600/410 |

* cited by examiner

*Primary Examiner*—Louis M. Arana
(74) *Attorney, Agent, or Firm*—Schiff Hardin LLP

(57) ABSTRACT

In a method for evaluating data of a magnetic resonance signal, a baseline is modeled and at least one metabolite signal is modeled. The modeling of the baseline ensues based on magnetic resonance data in the time domain, and using only data that begins with the magnetic resonance signal and having a length that is shorter than the duration of the overall magnetic resonance signal.

11 Claims, 7 Drawing Sheets

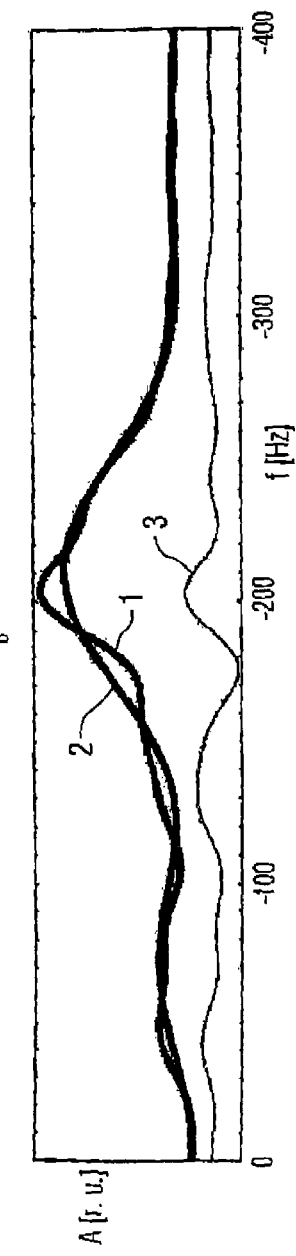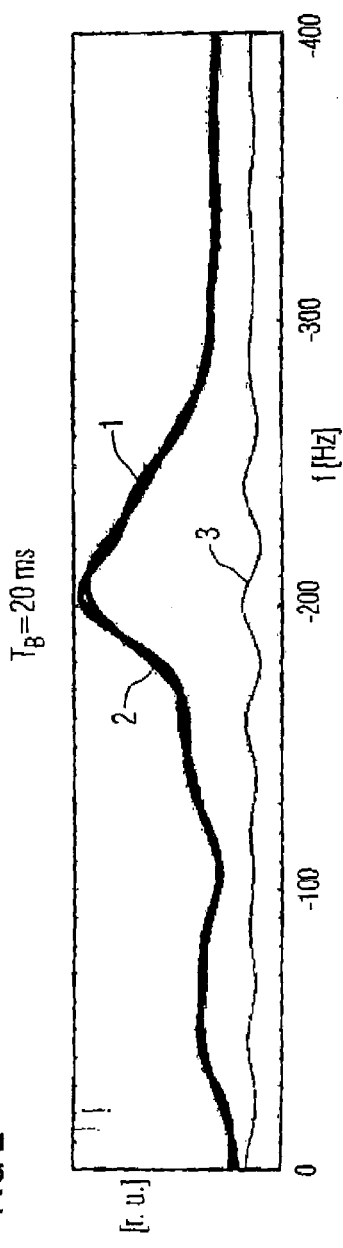

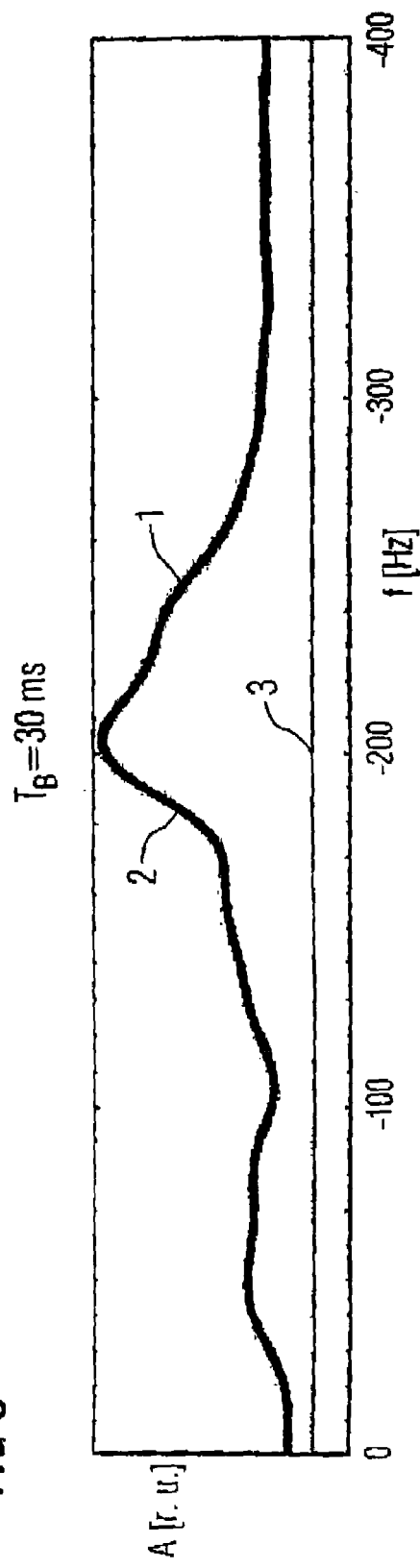

METHOD FOR EVALUATING MAGNETIC RESONANCE SPECTROSCOPY DATA USING A BASELINE MODEL

BACKGROUND OF THE INVENTION

1. Field of the Invention

The present invention concerns a method to evaluate magnetic resonance spectroscopy data with a determination of the baseline superimposed on the resonance signals.

2. Description of the Prior Art

Magnetic resonance spectroscopy (MRS) has been used for more than four decades in physical, chemical and biochemical basic research, for example as an analysis technique or for structural clarification of complex molecules. Like magnetic resonance tomography, magnetic resonance spectroscopy (MR spectroscopy) is based on the principle of nuclear magnetic resonance. Imaging is not the goal of MR spectroscopy, but rather the generation of magnetic resonance spectra (MR spectra) for analysis of substances such as for a structure clarification. The resonant frequencies of isotopes that possess a magnetic moment (such as, for example, $^1H$, $^{13}C$, $^{19}F$ or $^{31}P$) are dependent on the chemical environment of these isotopes. Thus the chemical structures in which the molecules are bound are mirrored in the respective resonant frequencies of the aforementioned isotopes. A determination of the resonant frequencies therefore enables differentiation between different materials. The signal intensity at the various resonant frequencies gives information about the concentration of the corresponding molecules.

If a molecule is brought into a basic magnetic field of a magnetic resonance apparatus, as occurs in spectroscopy, electrons of the molecule shield the nucleus of the molecule from the basic magnetic field. Due to this effect, the local magnetic field at the location of the nucleus changes by a few millionths of the external basic magnetic field. The associated change of the resonant frequency of this nucleus is called a chemical shift. Molecules thus can be identified using their chemical shift. The representation of MR signals in the frequency domain typically ensues as a curve of the signal intensity versus the chemical shift, wherein the chemical shift is given as a value relative to a reference signal and normalized to a reference signal. A dimensionless quantity thus is obtained, with smaller values designated in ppm (parts per million).

A resonance line of a nucleus may be split into a number of lines when further nuclei with a magnetic moment are located in the environment of the considered nucleus. The cause lies in what is know as the spin-spin coupling between the nuclei. The magnetic flux density of the basic magnetic field that a nucleus experiences thus depends not only on the electron shells around this nucleus but also on the orientation of the magnetic fields of the neighboring atoms.

Magnetic resonance spectroscopy using clinical magnetic resonance apparatuses is termed clinical magnetic resonance spectroscopy. In addition to MR imaging, MR spectroscopy provides information about the metabolic consistency of the examined tissue and also enables the in vivo examination of metabolic processes in people. In MR spectroscopy, many different metabolites are detectable, the existence and concentration of which can give information about neuronal functioning, metabolic changes and pathological changes in the brain, muscle tissue and other organs.

The techniques of localized magnetic resonance spectroscopy substantially differ from that of magnetic resonance imaging because, in addition to tomographic spatial resolution, the chemical shift also is resolved in spectroscopy. At the moment, two localization methods for magnetic resonance spectroscopy dominate in clinical application. One such method encompasses individual volume techniques based on echo methods, in which a spectrum of a previously selected target volume is registered. The other basic method encompasses spectroscopic imaging techniques, known as CSI methods (Chemical Shift Imaging) that simultaneously enable the recording of spectra of a number of spatially connected target volumes.

Spectroscopic examination methods are used both in clinical phosphor and proton spectroscopy. A three-dimensional CSI method includes, for example, the following steps: after a non-slice-selective 90° RF pulse, a combination of magnetic phase coding gradients of the three spatial directions is activated for a specific time, and after this the magnetic resonance signal in the presence of each gradient is read out. As mentioned, different combinations of phase coding gradients often are repeated until the desired spatial resolution is achieved. A four-dimensional Fourier transformation of the magnetic resonance signals provides the desired spatial distribution of the resonance lines. A two-dimensional CSI method results from the above-described three-dimensional CSI method, if the aforementioned, non-slice-selective RF pulse is replaced by a slice-selective excitation formed by a slice-selective RF pulse and a corresponding magnetic gradient, and a gradient in the phase coding direction is omitted.

The typically employed individual volume techniques are based on a detection of a stimulated echo or on a secondary spin echo. In both cases, a spatial resolution ensues by successive, selective excitations of three orthogonal slices. A target volume is defined by a slice volume of the aforementioned three slices. Only the magnetization of the target volume experiences all three selective RF pulses and thus contributes to the stimulated echo, or to the secondary spin echo. The spectrum of the target volume is obtained by one-dimensional Fourier transformation of a time signal corresponding to the stimulated echo or, respectively, the secondary spin echo.

The intensive water signals frequently are suppressed in clinical proton spectroscopy. This is known as water suppression and a method for water suppression is, for example, the CHESS technique, in which the nuclear spins of the water molecules are first selectively excited by narrow-band 90° RF pulses and their transverse magnetization is subsequently dephased by switched magnetic field gradients. Thus—in the ideal case—a detectable magnetization of the water molecules is no longer present in a directly subsequent spectroscopy method.

For the volume to be examined, a magnetic resonance signal is generated (for example with one of the described methods) that is acquired in the time domain and that is transformed by a Fourier transformation into an associated spectrum, with, for example, a real part absolute value of the spectrum being represented. The spectrum is characterized by resonance lines that are designated as peaks. These resonance lines or peaks appear mostly in the form of sharp, bell-shaped curves. Each of the resonance lines or peaks can thereby be associated with a maximum amplitude value that in turn determines an associated frequency value, and thus a chemical shift, of the resonance line that, for example, is characteristic for the resonance line and thus for a very specific substance located in the volume and emitting a magnetic resonance signal. Furthermore, an integral value for one of the resonance lines or peaks in an absorption spectrum gives information about the concentration of the associated substance in the examined volume.

It is ultimately the goal of the evaluation of a spectrum to identify, using the resonance lines, the substances in the examined volume, and to determine their concentration within the volume. This information should be optimally acquired in a fully automatic evaluation method and be presented for further interpretation to a viewer of the spectrum, for example a diagnosing physician.

This evaluation, particularly of clinical in-vivo magnetic resonance spectra, is aimed first at freeing the spectrum or its time signal from diverse artifacts such as frequency shifts, phase shifts and baseline distortions. Subsequently, an adaptation (fitting) of theoretical curves to the spectrum or its associated time signal is implemented to identify and quantify the substances, in particular the metabolites, in the examined volume. Each contribution of each of the metabolites must be described by a model function used to produce the theoretical curve, the specification of this function often ensuing in the time domain. The adaptation of the theoretical curves can, however, be implemented both in the time domain and in the frequency domain, but working in the time domain (particularly with regard to handling missing or erroneous measurement (data) points) has the advantages of a simpler model parameterization and higher speed, since the calculation burden for Fourier transformations back and forth, between time domain and the frequency domain is not present. In particular, in vivo spectra, which are acquired with short echo time, have (in addition to the typical metabolite signals) background signals arising from portions of remaining water, macromolecules and lipids. The sum of the background signals (to which, in addition to the water residue, lipid contaminations and macromolecules, overlapping resonances of metabolites with very low concentration contribute) is generally summarized under the term baseline. The contributions to the baseline are to a strong degree dependent on the type of the examined tissue and the acquisition technique used. The baseline therefore must be considered in the modeling of the metabolite signals.

The specification of the baseline ensues with a baseline model, also called a baseline model function. It can ensue in the frequency domain (frequency space) or in the time domain. In the frequency domain, smooth, slowly changing functions such as polynomials or splines, as well as wavelet representations, are conventionally used to specify or parameterize the baseline. Currently, Voigt lines or experimentally determined model spectra are used in the time domain. The parameterization by Voigt lines and model spectra is hereby limited to special applications, since each requires foreknowledge about the examined tissue. Full particulars for model formation or modeling of the baseline by means of wavelet representations and splines is described, for example, in the article by B. J. Soher et al. "Representation of Strong Baseline Contributions in $^1$H MR Spectra", Magnetic Resonance in Medicine 45, 2001, pages 966 through 972.

Evaluation of an MR spectrum also can ensue on the basis of the data of the MR signal in the time domain without modeling the baseline. For this the first points of the magnetic resonance signal, which form the main portions of the baseline are not incorporated into the modeling of the metabolite signals. This method, however, leads to a worsening of the signal-to-noise ratio, meaning the signal-to-noise ratio of the modeled magnetic resonance signal portion drops and the adapted parameters exhibit a greater uncertainty. In the case of narrowly adjacent or strongly overlapping metabolite signals, this method actually breaks down entirely when an insufficient number points are omitted, since contributions of adjacent metabolites can mix, and the individual metabolite signals are overshadowed.

SUMMARY OF THE INVENTION

An object of the present invention to provide a method to evaluate the data of a magnetic resonance signal in the time domain that enables a low-noise, exact modeling of the metabolite signals of interest.

This object is achieved in accordance with the invention by a method for evaluating data of a magnetic resonance signal including the steps of modeling a baseline and modeling at least one metabolite signal, the modeling of the baseline ensuing on the basis of magnetic resonance data in the time domain, and only data from a time interval that begins with the magnetic resonance signal and that has a length that is shorter than the duration of the total magnetic resonance signal, are used to model the baseline.

The method can be implemented by a computer program product for evaluating the data of a magnetic resonance signal, the computer program product having a series of physically differentiable states that can be read and executed by a data processing device and that represent a sequence of instructions that implement the inventive method when executed by the data processing system.

At the beginning of a magnetic resonance signal acquired in vivo, as it is shown in the time domain, the portion of the components that are associable with the baseline outweigh the portion of the components which are associable with the metabolite signals. Furthermore, the portion of the baseline at the MR signal decays significantly faster than the portion of the metabolite spectrum. The portion of the baseline at the MR signal after 30 ms of a total duration of 200 ms can thus already have decayed to 13% of its original value; but the portion of the metabolite signal can still be present at 75%. Use of the first MR data of a magnetic resonance signal therefore already allows the modeling of a baseline with good precision. Furthermore, since these first MR data are not lost for modeling the metabolite signals of interest, the inventive evaluation method also achieves a low-noise and exact modeling of these metabolite resonances. The modeling of the baseline also ensues exclusively on the basis of the data of the MR signal in the time domain, such that no additional Fourier transformations back and forth are necessary, and very short calculation times are achieved. The method exhibits no limitation to special applications and thus can be used universally.

To obtain an optimally low-noise model of a baseline, the MR data with the highest portion of components of the baseline (these being the first data at the beginning of the time interval and thus also the first data of the identified magnetic resonance signal) are incorporated into the modeling of the baseline.

Since the MR data used to model the baseline also contain (represent) portions of the metabolite signals in respectively different degrees, the parameterization of the line form (shape) of the baseline be effected together with the parameterization of the line form of the metabolite signal. Short calculation times thus also result for the modeling of the entire MR signal. The model functions for describing a metabolite resonance are mathematically simpler to realize in the time domain than in the frequency domain. The variation of the parameter for optimization of the modeling of the baseline thus appropriately ensues in a mutual step with the variation of the parameter for optimization of the modeling of at least one metabolite signal. In particular the variation of the parameter can alternatingly ensue in an iteration method in the time domain for the baseline and the at least one metabolite signal. In a preferred embodiment, for this the iteration method is begun with an estimation of at least one metabolite signal as a starting value for the iteration.

An overshadowing of the metabolite resonances not corresponding to reality can be prevented by restringing at least one parameter to optimize the modeling of the baseline, the restringing preferably being accomplished by the introduction of parameter limits or by limiting the portion of the baseline on the overall signal.

Due to the truncating effect associated therewith, the limitation to MR data of a limited time span for modeling the baseline leads to higher-frequency portions not corresponding to reality in the baseline model function. In order to suppress these portions, the modeled baseline is apodized. The apodization can advantageously ensue with an exponentially falling filter function, such that the model function of the baseline at the end of the time interval (meaning the time span) has died away.

To improve the smoothness of the baseline in the frequency domain representation, the modeled baseline can be regularized.

DESCRIPTION OF THE DRAWINGS

FIGS. 1 through 3 show the influence of the finite duration tB on the description of the baseline model.

DESCRIPTION OF THE PREFERRED EMBODIMENTS

Figure 4:
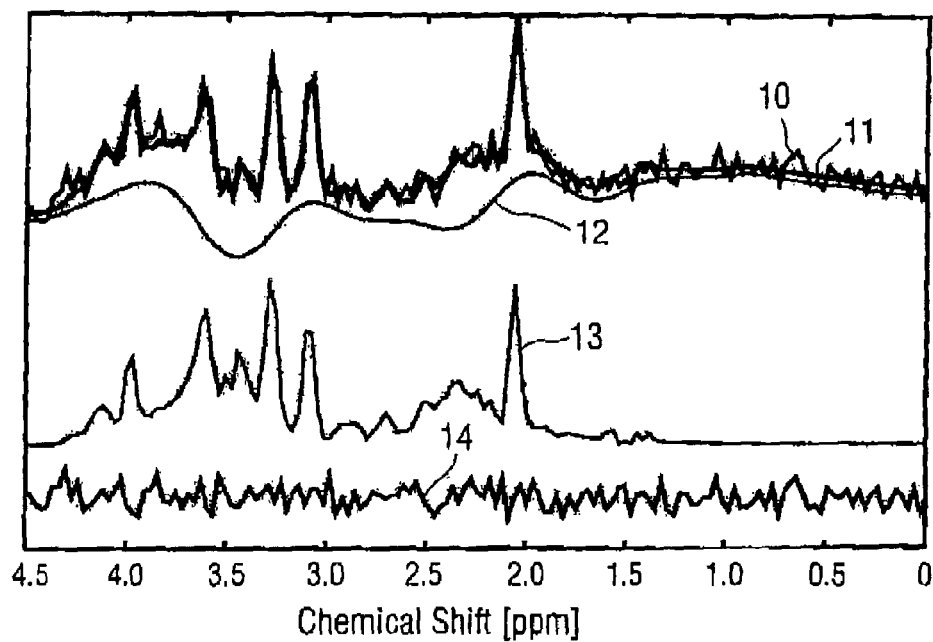
FIGS. 4 through 7 show results of an MR signal evaluation with various finite baselines according to the present invention and different parameter specifications.

A magnetic resonance spectroscopic examination of a tissue provides a damped, nuclear magnetic resonance signal (MR signal), what is known as the free induction decay (FID) signal, oscillating periodically with the Lamour frequency, The Fourier-transformed FID signal is generally designated as a resonance curve, but the term absorption spectrum also has become common in MR spectroscopy with for this curve. Below, the representation of the nuclear magnetic resonance signals in the time domain is designated as an MR signal, and the representation of the nuclear magnetic resonance signals in the frequency domain is designated as a resonance curve.

For a digital representation of an MR signal, it is sampled with at least double the Lamour frequency, such that it is available as an MR data set for extensive further processing. In the following the terms MR signal and MR data set are used synonymously, since digital processing, meaning evaluation of a nuclear magnetic resonance measurement, is assumed. Within the MR data set, the individual, discrete data are ordered in the sequence of their temporal occurrence, such that a one-to-one association exists between the measurement time and the arrangement of the discrete data in the MR data set. Therefore, for a clearer representation and insofar as it is possible, the time representation equivalent to the arrangement of the discrete data within the data set is used in the following.

In the framework of an evaluation to identify and possibly quantify metabolites in the examined tissue, the MR data set $s(t)$ formed by the discrete MR data $s_i$ is simulated by a model function $\hat{s}(\vec{x})$. For simulation, the individual parameters $x_j$ of the parameter set $\vec{x}$ are varied with the goal of achieving an optimal adaptation of the model function $\hat{s}(\vec{x})$ to the measurement signal $s(t)$. The measurement signal is composed of signal portions of the metabolites of interest and background signal portions forming the baseline. In addition to the metabolites, the baseline therefore is modeled in the time domain to determine $\hat{s}(\vec{x})$.

Due to the rapid temporal decay of the baseline portions on the MR signal that correspond with a slow variation of the baseline in the frequency domain, the baseline can be characterized as a time signal of finite duration $t_B$. The time interval $t_B$ should be significantly shorter than the duration of the entire MR signal. A baseline model that is based only on measurement data from this first time span $t_B$ is designated as a finite baseline.

A simple realization of a baseline model with finite time duration $t_B$ exists in the omission of the first points in time of the MR signal $s(t)$ for a calculation of a first estimation of a metabolite model $\hat{m}(t)$ and the definition of the baseline as a difference between MR signal $s(t)$ and metabolite model $\hat{m}(t)$ for this time period. The following thus is obtained as a definition of this first baseline model:

$$\hat{b}_1(t) = \begin{cases} s(t) - \hat{m}(t), & t \leq t_B \\ 0, & t > t_B \end{cases} \quad (1)$$

At the time $t=t_B$ the finite baseline $\hat{b}_1(t)$ typically has still not fallen to zero. A time signal that has not yet fallen to zero at the end of its time span can be understood as a product of a longer complete time signal with a rectangle function that represents the truncation of the last signal part. The Fourier transformation of this product is a folding of the Fourier transformation of the time signal with the Fourier transformation of the rectangle (square wave) function, and yields a spectral line with symmetrical adjacent maxima. A finite baseline according to equation (1) therefore can contain spectral portions that do not correspond to reality.

In order to ensure that the model of the baseline has decayed up to the truncation point in time $t_B$, and thus the truncation effect at the end of the scan time is attenuated or no longer ensues, the baseline model is additionally apodized in a second embodiment of the invention.

In addition to this, the baseline $\hat{b}_1(t)$ defined in equation (1) is multiplied with a temporally decreasing filter function. In addition to the intended minimization of the distortions, this also leads to a faster decay of the time signal, and with it to a realistic slower change of the baseline in the frequency domain.

In a preferred embodiment of the invention, a filter function exponentially decreasing with the time constant $T_B$ is used. The second baseline mode $\hat{b}_2(t)$ thus is obtained:

$$\hat{b}_2(t) = \hat{b}_1(t) \cdot e^{-\frac{t}{T_B}} \quad (2)$$

or $$\hat{b}_2(t) = \begin{cases} e^{-\frac{t}{T_B}} \cdot (s(t) - \hat{m}(t)), & t \leq t_B \\ 0, & t > t_B \end{cases} \quad (2a)$$

In order to filter out the higher-frequency signal portions not corresponding to reality, and to improve the smoothness of the baseline model, the spectral variation possibility of the baseline is further limited by regularization. For this, the target function is expanded to optimize the parameter set $\vec{x}$ by a regularization penalty function.

The target function describes the deviation of the model function $\hat{s}(\vec{x})$ from the MR signal $s(t)$. One approach that is frequently used for optimization seeks the parameter distribution $\vec{x}$ for which the probability distribution is maximal for a given data vector $s(t)=[s_0, \ldots, s_{N-1}]^T$. This approach is designated as a maximum-likelihood estimation. It is assumed that each individual measurement value $s_n$ of the data vector $s(t)$ scatters with the standard deviation according to a Gaussian distribution by its true value $\hat{s}_n$ determined by the model function; the MR signal $s(t)$ is thus afflicted with a white noise. The maximum-likelihood estimation then can ensue by minimization of the quadratic differences between data $s(t)$ and model function $\hat{s}(\vec{x})$. This corresponds to a procedure according to the method of the least square (NLLS: Non-Linear Least Squares). In this procedure, the following cost function is minimized as a target function:

$$f(x) = \sum_{n=0}^{N-1} (s_n - \hat{s}_n(\bar{x}))^2 = \sum_{n=0}^{N-1} r_n(\bar{x})^2 \quad (3)$$

The functions $r_n(\vec{x})$ also are called residuals, and in the ideal case reproduce the noise portion of the measurement signal.

Given use of the cost function according to equation (3) to optimize the parameter set $(\vec{x})$, the expanded target function results:

$$\sum_i (s(t_i) - \hat{s}(t_i))^2 + \rho \cdot \|R\|^2, \quad (4)$$

i.e., not only is the difference between the measurement value $s(t_i)$ and the corresponding value of the model function $\bar{s}(t_i)^2$ minimized, but also a portion (determined by $\rho$) of the roughness of the baseline $\|R\|^2$ is incorporated into the minimization process, such that a compromise between good adaptation of the overall model function $\hat{s}(t)$ to the data $s(t)$ ($\rho \to 0$) and a smooth spectral baseline ($\rho \to \infty$) can be defined by means of the quantity $\rho$. The difference of adjacent spectral values of the baseline model $\hat{B}(\omega)$ is set in the frequency domain as a measure for the roughness of the baseline $\|R\|^2$.

$$\|R\|^2 = \sum_i (\hat{B}(\omega_i) - \hat{B}(\omega_{i-1}))^2 \quad (5)$$

Regularized models of the baseline of the type $\hat{b}_1(t)$ and $\hat{b}_2(t)$ are further characterized by $\hat{b}_{1,R}(t)$ and $\hat{b}_{2,R}(t)$.

The maximum possible spectral flexibility of a baseline model is determined by the time span $t_B$. The finite baseline can be understood as a product of a signal continuing longer than $t_B$ with a rectangle function $r(t)$ of the width $t_B + \Delta t$ that is additionally shifted to the right by $t_B/2$;

$$r(t) = \Pi\left(\frac{t}{t_B + \Delta t} - \frac{t_B}{2}\right) \quad (6)$$

By $\Pi(t)$, what is thereby understood is the general rectangle (square wave) function $$\Pi(t) = \begin{cases} 1 & |t| \leq \frac{1}{2} \\ 0 & |t| > \frac{1}{2} \end{cases} \quad (6a)$$

The spectrum of $r(t)$ is characterized by $$R(\omega) \sim \operatorname{sinc}\left(\frac{(t_B + \Delta t)\omega}{2\pi}\right) \cdot e^{j\frac{t_B}{2}\omega} \quad (6b)$$

and describes the maximum spectral flexibility of the baseline using the line width $\lambda$ of its absorption portion $R_{Abs}(\omega)$. The line width $\lambda$ is determined according to equation (6b) by the phase modulation $$e^{j\frac{t_B}{2}\omega}.$$

Approximated by the first zero point of the absorption portion, it yields:

$$\lambda(R_{Abs}(\omega)) \cong \frac{\pi}{t_B}. \quad (6c)$$

The influence of the length of the baseline model $t_B$ on the baseline description is shown in the images of FIGS. 1 through 3 for a synthetic baseline of the duration 30 ms. The baseline model 2 becomes more flexible with increasing quantity $t_B$ and better adapts to the real baseline 1. In addition to the absorption spectra of the synthetic baseline 1 and the baseline model 2, that of the respective residual 3 is shown in the images of FIGS. 1 through 3.

The determination of the parameter, in particular of the main parameter $t_B$, is of decisive importance in order to achieve plausible results for baseline model and metabolite model. The determination of the parameters within the optimization in which the parameters can be varied is not target-oriented. The reason for this is that the result alone is found according to the measure of the minimal residual that is combined of the sum of baseline and metabolites. It is not considered as to what extent it is reasonable for the found representations for the baseline and for the metabolites to be individually viewed.

Two ways are conceivable to select the parameters. One is to set the parameter using the spectral quality. Thus, $t_B$ can be set using the ensuing line width $\lambda$ ($t_B \sim 1/\lambda$). A disadvantage of this approach is that the results can vary significantly depending on the spectral quality. Alternatively, $t_B$ can be oriented to known features of the components that contribute to the baseline. For the macromolecules, the magnitude of the in vivo relaxation times are known ($T_1 \cong 250$ ms and $T_2 \cong 44$ ms a magnetic field of 2.1 T). The values of $T^*_2$ lie at 15 ms (STEAM, $T_E = 20$ ms at 1.5 T). Based on this value, a value of 30 ms for $t_B$ appears to be a suitable compromise for the description of brain spectra with short echo time. On the one hand, after this time 87% of the baseline signal have disappeared, on the other hand approximately 75% of the metabolite signal is still present. The selection for $\rho$ can be made dependent on the signal-to-noise ratio (SNR) ($\rho 01/$SNR). For an optimally flexible treatment of the baseline model, the parameters are preferably freely adjustable. An automatic population of the parameters can be enabled in reasonable adjustments for the baseline parameters to be found by means of a test phase.

If the baseline model $\tilde{b}_1$ is applied to signals of poor quality, such as, for example, signals with low SNR or large spectral line widths, undershoots of the baseline can ensue. This means in the framework of these embodiments, regions of the absorption spectrum of the baseline with amplitudes below the noise level of the absorption spectrum of the signal, and which are therefore not reasonable. Baseline undershoots can ensue given signals of poor spectral quality when many overlapping metabolites that mutually compensate are modeled. The creation of overshoots can be illustrated using the truncated metabolite model whose first signal value is at $t_B + \Delta t$. The oscillating signal edges of the various metabolites can be mutually compensated via the shifting of the time zero point or, respectively, the impression of a linear phase in the spectrum, such that the resulting amplitude values for the individual metabolites are inflated. In the overall model, this signal inflation of the metabolites is caught by a baseline, of which some regions of the absorption spectrum are negative or, respectively, undershot. By reducing the variation possibility of the baseline via the additional apodization of $\tilde{b}_1$ in $\tilde{b}_2$ or via regularization, it can be prevented that undershoots occur in the baseline.

The description of the baseline in the time domain with the presented models thus has the following advantages:

The methods are independent of start values for the baseline.

The baseline models require no parameters to be optimized.

The models are simultaneously determined for metabolites and baseline

No iterative method is necessary.

The integration of the baseline costs as little as zero calculation time.

The results that can be achieved with the preceding presented models are exemplarily shown using the images in FIG. 4 through 7. The following quantities or model characteristics are associated with the representations:

FIG. 4: $\tilde{b}_1$ with $t_B = 30$ ms, meaning baseline model type 1 with typical baseline length, FIG. 5: $\tilde{b}_1$ with $t_B = 30$ ms and $\rho = 50$, meaning baseline model type 1 with typical baseline length and regularization, FIG. 6: $\tilde{b}_1$ with $t_B = 15$ ms, meaning baseline model type 1 with halved typical baseline length, and FIG. 7: $\tilde{b}_2$ with $t_B = 30$ ms and $T_B = 60$ ms, meaning baseline model type 2 with typical baseline length.

Figure 5:
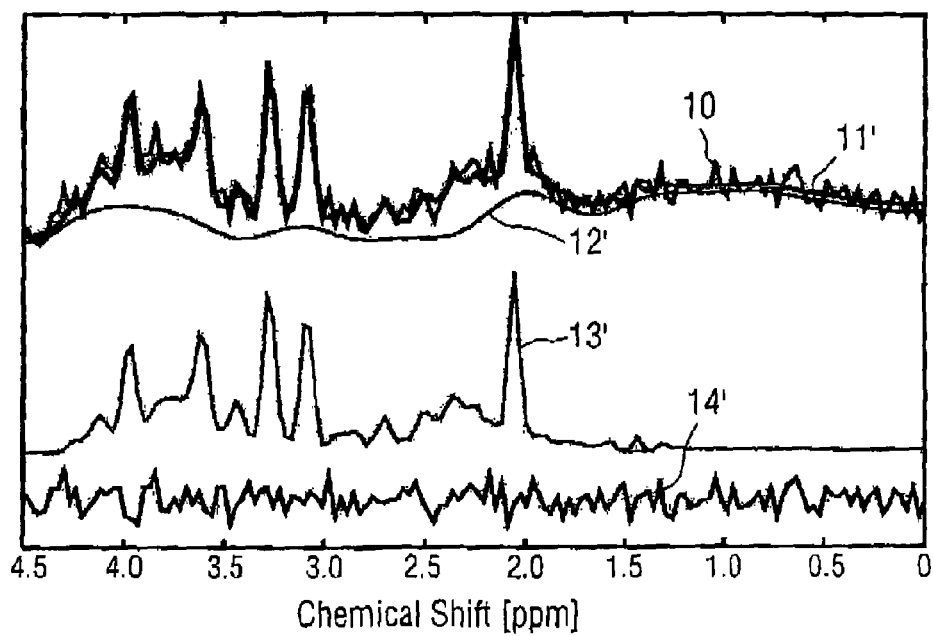
Figure 6:
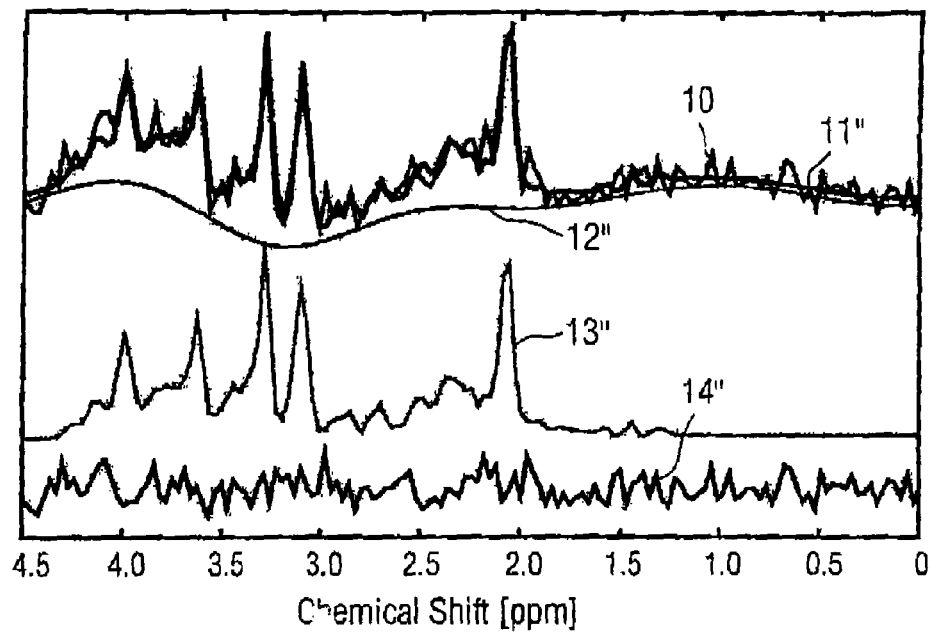
Figure 7:
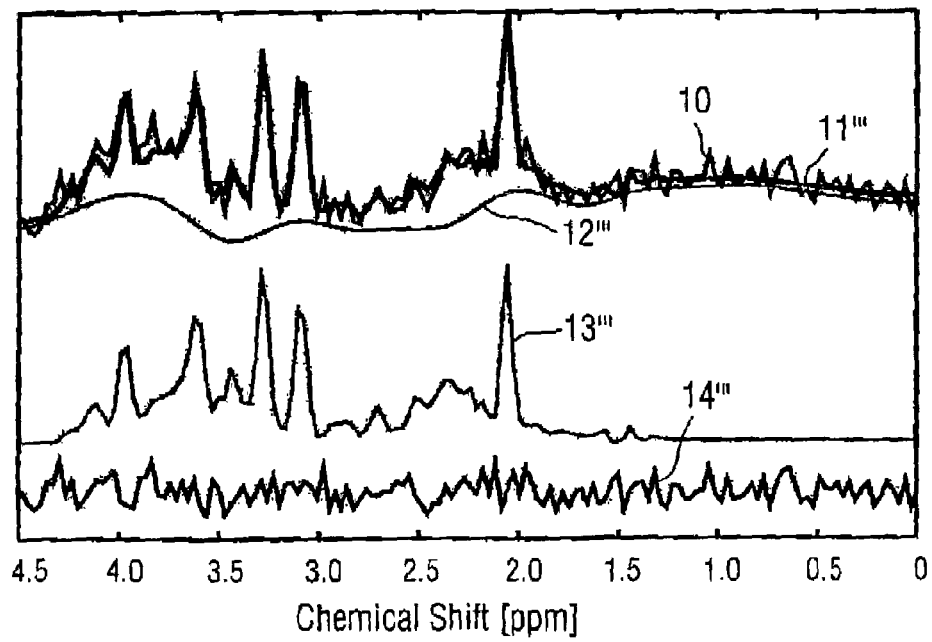

The found baseline representations vary depending on the baseline model used. In the representation of FIG. 4, undershoots occur in the ranges at 2.4 and 3.4 ppm that correspond with increased amplitudes for Glu, Gln, GABA and Tau. They disappear upon use of the regularization, as is seen in FIG. 5. The overshoots can likewise be prevented by a reduction of $t_B$ is shown in FIG. 6. At the same time, the variability of the baseline is clearly limited in comparison to the case of the image in FIG. 5, The undershoots likewise reduce given the filtered baseline type according to the image in FIG. 7.

Figure 8:
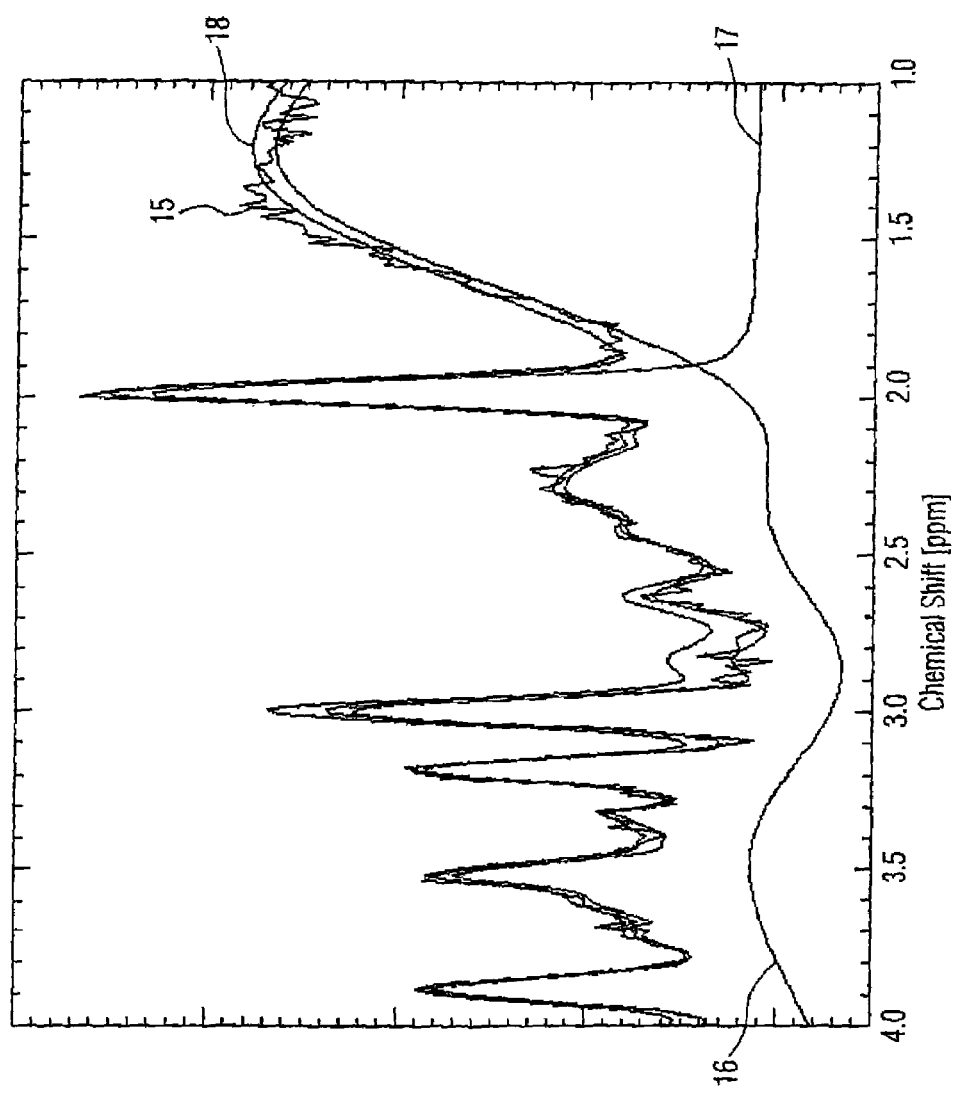
FIG. 8 shows an absorption spectrum with non-iteratively acquired model spectra for baseline and metabolite resonances according to the present invention.

In FIG. 8, an MRS absorption spectrum 15 is shown in comparison with a finite baseline model 16, a metabolite model 17 and an overall model 18 that is formed from the sum of baseline model and metabolite model. A finite model specified above with predeterminable time duration $t_B$ (which is smaller than the time duration of the magnetic resonance signal to be evaluated) forms the basis of the model of the baseline, The modeling ensues in the time domain by means of a set of complex parameters, such that individual points of the baseline are described in the time domain, The baseline of FIG. 8 was calculated on the basis of the first twenty (as an example) MR data entries of the associated magnetic resonance signal. An unwanted overshadowing of the metabolites, as it is subsequently explained using FIG. 10 with regard to a method without baseline model according to the prior art, is reliably prevented by a restringing of the baseline parameters. One of the possibilities for restringing of the baseline parameters is the introduction of parameter limits that limit the variation range for each parameter. If a plausible estimation of the baseline exists based on start values, this estimation can be used to define the parameter limits for each baseline parameter. In another embodiment, the restringing of the baseline is implemented by limiting the portion of the baseline is limited to the overall signal, meaning the baseline should be low in comparison to the overall signal. This limitation of the baseline can be realized by the introduction of extra (secondary) conditions In the parameter adaptation. For models of the metabolites, the known models that can be determined in the time domain are used to.

Figure 9:
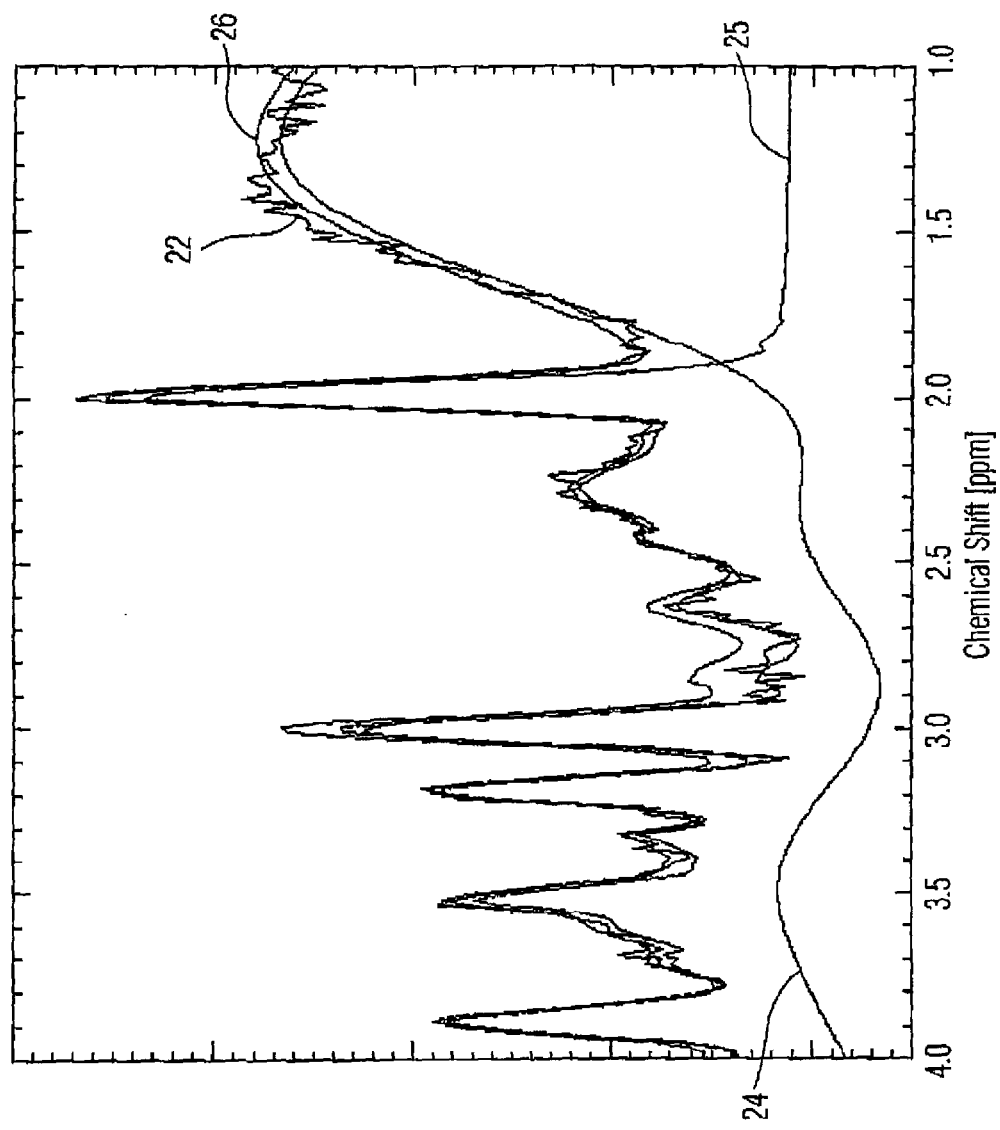
FIG. 9 shows an absorption spectrum with iteratively acquired model spectra for baseline and metabolite resonances according to the present invention.

FIG. 9 shows the absorption spectrum 22 (identical with the resonance curve 15 of FIG. 8) in comparison with the baseline 24 and metabolite function 25 (respectively obtained via an iterative modeling). In this iterative method, a plausible estimation of the metabolite model is preferably first determined, based upon which the model function of the baseline is optimized, followed by an optimization of the metabolite function that precedes a further optimization of the baseline model function, and so forth. FIG. 9 shows the result for three iterations. The description for FIG. 8 is correspondingly valid for the models of the metabolites and the baseline. The curve 26 reproduces the overall model of the absorption spectrum formed from the sum of baseline 24 and metabolite model 25. It can be recognized that the individual courses or curves 24, 25 and 26 in FIG. 9 are nearly identical with the respective curves 16, 17 and 18 of FIG. 8, which indicates both procedures as being nearly identical in effect. The described modeling of the baseline therefore requires no iterative method.

Figure 10:
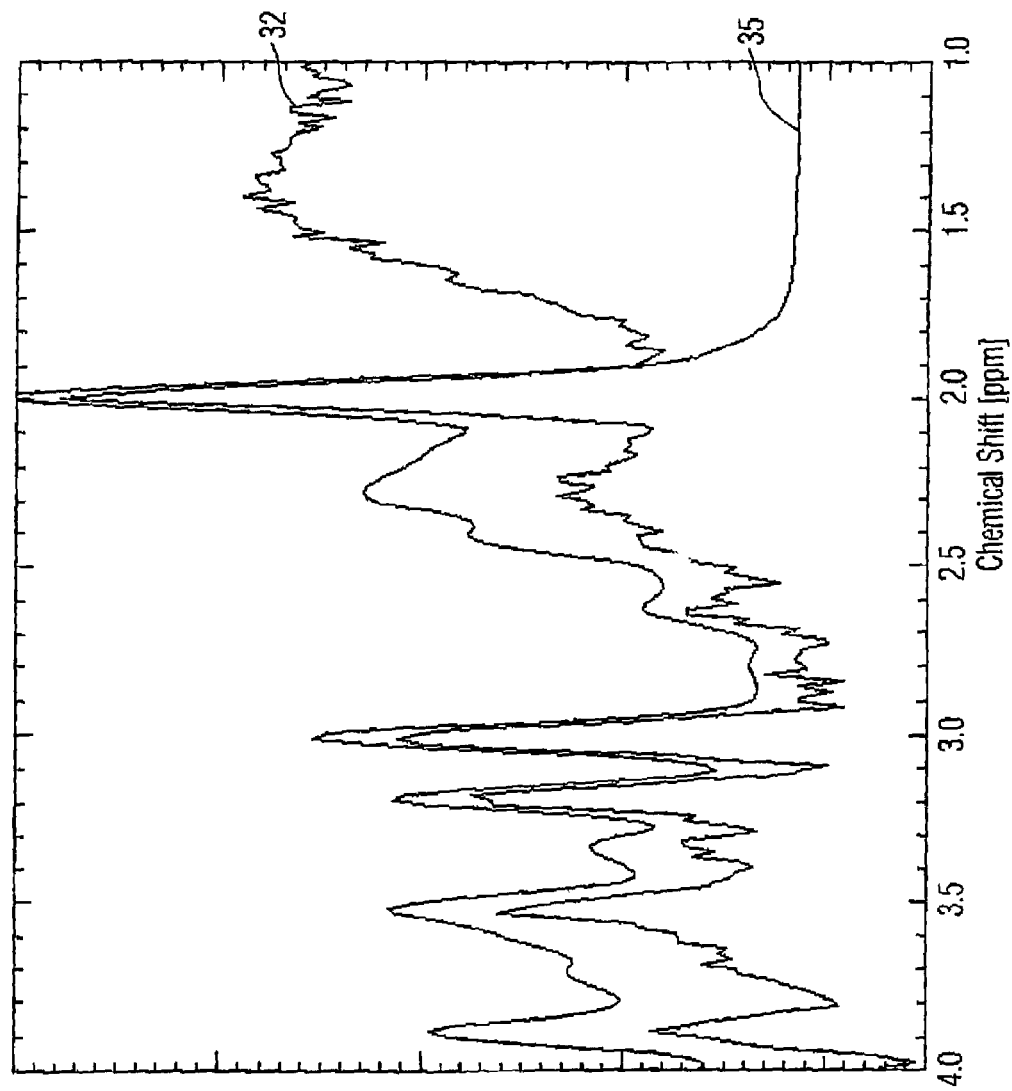
FIG. 10 shows an absorption spectrum with a model for the metabolite resonances obtained according to the prior art.

FIG. 10 shows for comparison purposes spectral curves that are created in modelings according to the prior art. The resonance curve 32 was acquired from the same MR signal as the absorption spectra 15 and 22 of FIGS. 8 and 9, but omitting the first twenty points of the MR signal in the time representation. The metabolite model 35 was created without modeling of the baseline. It can be recognized that the modeled metabolite resonances 35 are clearly inflated in parts in comparison with the corresponding resonance curves 17 and 25, which can in the worst case be a source of a misdiagnosis.

Although modifications and changes may be suggested by those skilled in the art, it is the intention of the inventor to embody within the patent warranted hereon all changes and modifications as reasonably and properly come within the scope of her contribution to the art.

I claim as my invention:

1. A method for evaluating data of a magnetic resonance signal, comprising the steps of:
    modeling a baseline based on magnetic resonance data in the time domain, using only data from a time interval that begins with the magnetic resonance signal and having a length that is shorter than a duration of an entirety of the magnetic resonance signal; and
    modeling at least one metabolite signal.

2. A method according to claim 1 comprising introducing first data of the magnetic resonance signal at a beginning of the time interval in the modeling of the baseline.

3. A method according to claim 1 comprising varying parameters for optimizing modeling of the baseline in a common step with variation of parameters for optimizing the modeling of said at least one metabolite signal.

4. A method according to claim 3 comprising varying parameters for optimizing the modeling of the baseline and varying parameters for optimizing of the modeling of said at least one metabolite signal alternatingly in an iteration procedure in the time domain.

5. A method according to claim 4 comprising beginning said iteration procedure with an estimation of at least one metabolite signal.

6. A method according to claim 1 comprising optimizing modeling of the baseline by restricting at least one parameter by introducing parameter limits.

7. A method according to claim 1 comprising optimizing modeling of the baseline by restringing at least one parameter by limiting a portion of the baseline in the overall signal.

8. A method according to claim 1 wherein the modeling of the baseline produces a modeled baseline, and comprising the additional step of apodizing said modeled baseline.

9. A method according to claim 8 comprising apodizing said modeled baseline with an exponentially dropping filter function.

10. A method according to claim 1 wherein the modeling of the baseline produces a modeled baseline, and comprising the additional step of regularizing said modeled baseline.

11. A computer program product for evaluating data of a magnetic resonance signal, said computer program product, when loaded into a computer, causing said computer to:
    model a baseline based on magnetic resonance data in the time domain, using only data from a time interval that begins with the magnetic resonance signal and having a length that is shorter than a duration of an entirety of the magnetic resonance signal; and
    model at least one metabolite signal.

* * * * *